US011549843B2

(12) United States Patent
Fu et al.

(10) Patent No.: US 11,549,843 B2
(45) Date of Patent: Jan. 10, 2023

(54) ULTRASONIC SENSING DEVICE

(71) Applicant: Qian Jun Technology Ltd., Zhubei (TW)

(72) Inventors: Yu-Yen Fu, Zhubei (TW); Po-Chun Yeh, Zhubei (TW); Dong-Fu Chen, Zhubei (TW)

(73) Assignee: Qian Jun Technology Ltd., Zhubei (TW)

( * ) Notice: Subject to any disclaimer, the term of this patent is extended or adjusted under 35 U.S.C. 154(b) by 347 days.

(21) Appl. No.: 16/847,672

(22) Filed: Apr. 14, 2020

(65) Prior Publication Data
US 2020/0393292 A1 Dec. 17, 2020

(30) Foreign Application Priority Data

Jun. 12, 2019 (TW) .................................. 108120214

(51) Int. Cl.
*G01H 11/08* (2006.01)
*H01L 41/113* (2006.01)
*H01L 41/23* (2013.01)
*H01L 41/25* (2013.01)
*G01N 29/24* (2006.01)
*G01N 29/00* (2006.01)
*G01N 29/22* (2006.01)

(52) U.S. Cl.
CPC ............ *G01H 11/08* (2013.01); *G01N 29/00* (2013.01); *G01N 29/22* (2013.01); *G01N 29/2437* (2013.01); *H01L 41/1132* (2013.01); *H01L 41/23* (2013.01); *H01L 41/25* (2013.01)

(58) Field of Classification Search
CPC ..... G01H 11/08; H01L 41/1132; H01L 41/23; H01L 41/25; H01L 41/053; G01F 23/2968; G04B 47/066; G01L 11/06; G01L 9/0022; G01L 23/222; G01N 29/00; G01N 29/2437; G01N 29/223
See application file for complete search history.

(56) References Cited

U.S. PATENT DOCUMENTS

| 5,376,860 | A  | * | 12/1994 | Sato ...................... G01L 23/222 |
| | | | | 310/346 |
| 9,505,031 | B2 | * | 11/2016 | Wilt ..................... G10K 11/004 |
| 10,319,897 | B2 | * | 6/2019 | Ohashi ................ H01L 41/1132 |
| 2018/0226564 | A1 | * | 8/2018 | Itayama .................. H01L 41/27 |
| 2020/0200885 | A1 | * | 6/2020 | Sato ........................ H04R 17/00 |
| 2020/0395529 | A1 | * | 12/2020 | Lee .......................... H01L 41/23 |

* cited by examiner

*Primary Examiner* — Galina G Yushina

(57) ABSTRACT

An ultrasonic sensing device includes a housing, a piezoelectric assembly, a board and a plurality of fixing members. The housing includes a connecting board being a metal board and a supporting shell being a plastic member. The supporting shell includes a bottom wall opposite to a disposing opening of the connecting board and a surrounding side wall integrally surrounding and connecting to the bottom wall. The surrounding side wall encloses a portion of the connecting board. The piezoelectric assembly includes an encapsulating body and a piezoelectric sheet enclosed by the encapsulating body. The encapsulating body is disposed on the bottom wall and surrounded by the surrounding side wall. The piezoelectric sheet has a sensing surface exposed to the encapsulating body and facing the bottom wall. The fixing members fix the board on the connecting board, thereby pressing the sensing surface of the piezoelectric sheet to the bottom wall.

17 Claims, 4 Drawing Sheets

ULTRASONIC SENSING DEVICE

FIELD OF THE INVENTION

The present invention relates to a sensing device, and more particularly to an ultrasonic sensing device including a piezoelectric assembly.

BACKGROUND OF THE INVENTION

A diesel engine needs to be equipped with Selective catalytic reduction (SCR) to reduce toxic nitrogen oxide (NOx) emission. SCR can neutralize the toxic nitrogen oxide by adding urea to the diesel fuel to convert the toxic nitrogen oxide into water and nitrogen. When the concentration of urea in the diesel is insufficient, the diesel engine may have too much toxic nitrogen oxide emission.

The urea used in the diesel engine may be mixed with water and stored in a storage tank adjacent to the diesel engine. Usually, a plurality of ultrasonic detecting devices can be arranged beside the storage tank to detect the urea concentration or liquid level of the urea in the storage tank.

The conventional ultrasonic sensing device primarily comprises a housing and a piezoelectric sheet placed in the housing. In order to attach the piezoelectric sheet to the sensing surface in the housing, it is necessary to inject an encapsulant into the housing after placing the piezoelectric sheet in the housing.

However, sometimes the adhesive force of the encapsulant may be not able to tightly attach the piezoelectric sheet to the sensing surface, therefore causing reliability issue of the conventional ultrasonic sensing device.

In addition, it is always difficult to precisely control the amount of the encapsulant for the process of injecting the encapsulant into the housing, thereby causing material waste. Moreover, it is also difficult to control the quality of the piezoelectric sheet and the encapsulant in the housing or rework them.

Further, material of the housing can be metal or plastic. When the housing is made of a metal material, the resonance effect between the housing and the piezoelectric sheet is low. However, the housing may have an insufficient strength problem when the housing is made of a plastic material.

SUMMARY OF THE INVENTION

The present invention provides an ultrasonic sensing device having high reliability.

The present invention provides an ultrasonic sensing device having good resonance characteristics.

The present invention provides an ultrasonic sensing device including a housing, a piezoelectric assembly, a board and a plurality of fixing members. The housing includes a connecting board being a metal board and a supporting shell being a plastic member. The connecting board has a disposing opening. The supporting shell includes a bottom wall opposite to the disposing opening of the connecting board and a surrounding side wall integrally surrounding and connecting to the bottom wall. The surrounding side wall surrounds a portion of the connecting board from at an outer edge of the connecting board. The piezoelectric assembly includes an encapsulating body and a piezoelectric sheet. At least a portion of the piezoelectric sheet is enclosed by the encapsulating body. The encapsulating body is disposed on the bottom wall of the supporting shell and surrounded by the surrounding side wall. The piezoelectric sheet has a sensing surface exposed to the encapsulating body and facing the bottom wall. The board is disposed on the connecting board and has a pressing surface facing the encapsulating body and the connecting board. The plurality of fixing members is configured to fix the board on the connecting board of the housing to press the board to the encapsulating body of the piezoelectric assembly, thereby pressing the sensing surface of the piezoelectric sheet to the bottom wall.

The present invention provides an ultrasonic sensing device including a housing, a supporting shell, a piezoelectric assembly, a board and a plurality of fixing members. The housing is a metal member and includes a connecting board, a bottom wall and a first surrounding side wall. The connecting board, the bottom wall and the first surrounding side wall are integrally connected. The first surrounding side wall is connected between the connecting board and the bottom wall, and the connecting board has a disposing opening opposite to the bottom wall. The supporting shell is a plastic member and includes a second surrounding side wall surrounding a portion of the connecting board at an outer edge of the connecting board. The second surrounding side wall is further extended toward a direction away from the bottom wall. The second surrounding side wall has an opening at an end away from the bottom wall. The connecting board is located between the opening and the bottom wall. The piezoelectric assembly includes an encapsulating body and a piezoelectric sheet. At least a portion of the piezoelectric sheet is enclosed by the encapsulating body. The encapsulating body is disposed on the bottom wall and surrounded by the first surrounding side wall. The piezoelectric sheet has a sensing surface exposed to the encapsulating body and facing the bottom wall. The board is disposed on the connecting board of the housing and has a pressing surface facing the encapsulating body and the connecting board. The plurality of fixing member is configured to fix the board on the housing to press the board to the encapsulating body of the piezoelectric assembly, thereby pressing the sensing surface of the piezoelectric sheet to the bottom wall.

In an embodiment of the present invention, the board is a circuit board.

In an embodiment of the present invention, the piezoelectric assembly further includes a positive guide pin having an end connected to the piezoelectric sheet and a negative guide pin having an end connected to the piezoelectric sheet, the positive guide pin and the negative guide pin pass through the encapsulating body, and the board has two openings allowing the positive guide pin and the negative guide pin to pass therethrough.

In an embodiment of the present invention, the encapsulating body is adhered to the surrounding side wall.

In an embodiment of the present invention, the encapsulating body has a surrounding shape conformed to the surrounding side wall.

In an embodiment of the present invention, the piezoelectric assembly further comprises a matching layer or a conducting layer disposed on the sensing layer of the piezoelectric sheet and corresponding to vibration energy of the piezoelectric sheet.

In an embodiment of the present invention, each of the plurality of fixing members is a screw, the board has a plurality of through holes, and the connecting board has a plurality of screw holes.

In an embodiment of the present invention, the surrounding side wall is further extended toward a direction away from the bottom wall, and the surrounding side wall has an opening at an end away from the bottom wall, the connecting board is located between the opening of the surrounding side wall and the bottom wall, and the ultrasonic sensing device further includes a cover covering the opening.

In an embodiment of the present invention, the encapsulating body includes a matching layer and/or an absorbing layer corresponding to vibration energy of the piezoelectric sheet.

In an embodiment of the present invention, the housing is a metal member, and the supporting shell is a plastic member.

In the ultrasonic sensing device of the embodiments of the present invention, a board is used to press the encapsulating body, so that the piezoelectric is abutted against the bottom wall of the housing. Comparing with the conventional technology in which the piezoelectric sheet is merely connected to the housing by an encapsulant, the piezoelectric sheet of the embodiments of the present invention can be more tightly disposed on the bottom wall of the housing, thereby improving the reliability.

The connecting board of the ultrasonic sensing device of the embodiments used for fixing the board is made of metal to have higher durability, and the bottom wall for supporting the piezoelectric assembly and the surrounding side wall for surrounding the piezoelectric assembly are made of plastic to have better resonance characteristics, as such the problem that the conventional technology in which the ultrasonic detection device is difficult to satisfy both of structural strength requirement and resonance characteristics requirement is solved.

Other objectives, features and advantages of the invention will be further understood from the further technological features disclosed by the embodiments of the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
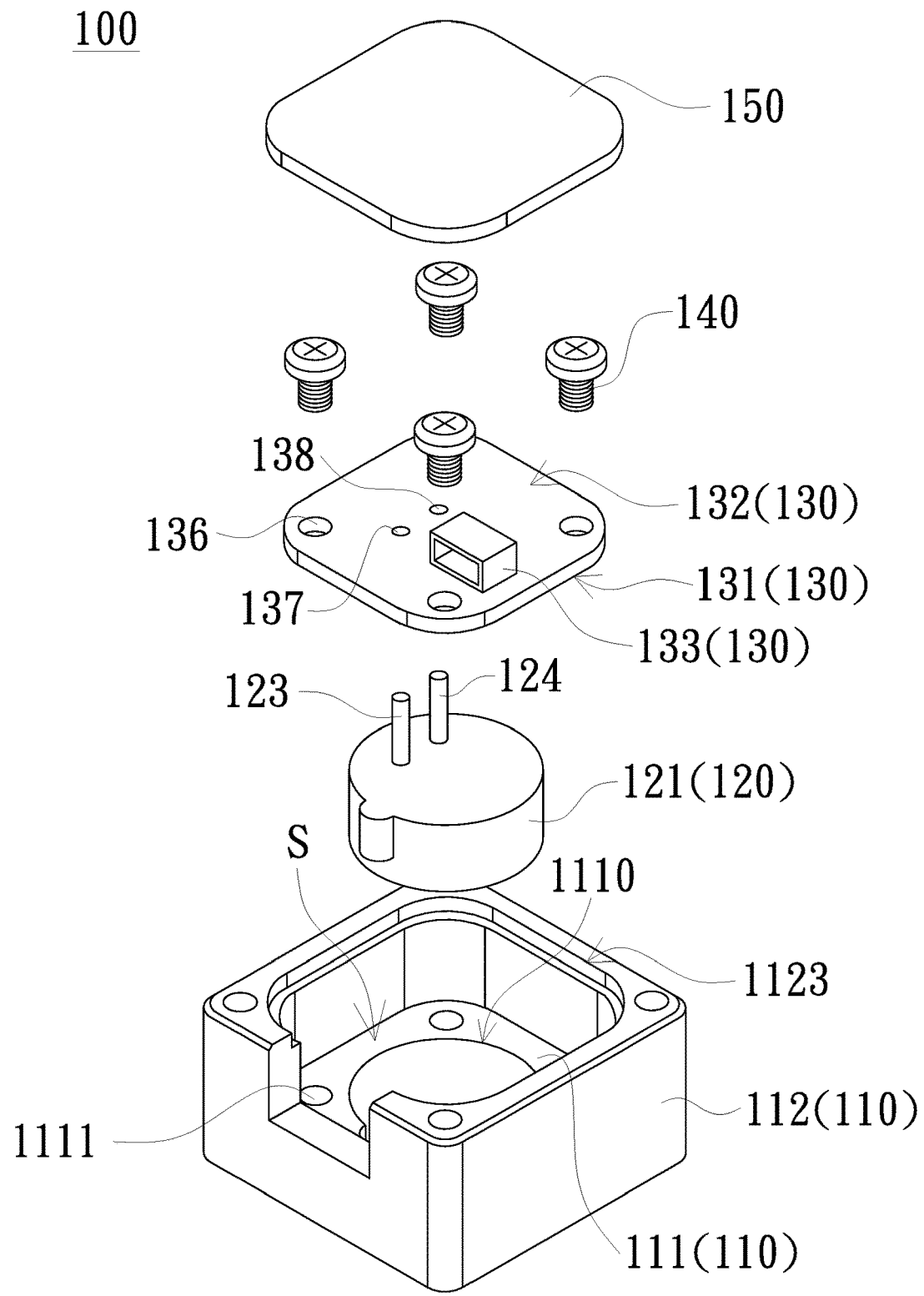
FIG. 1A is a schematic exploded view of an ultrasonic sensing device of an embodiment of the present invention.
Figure 1B:
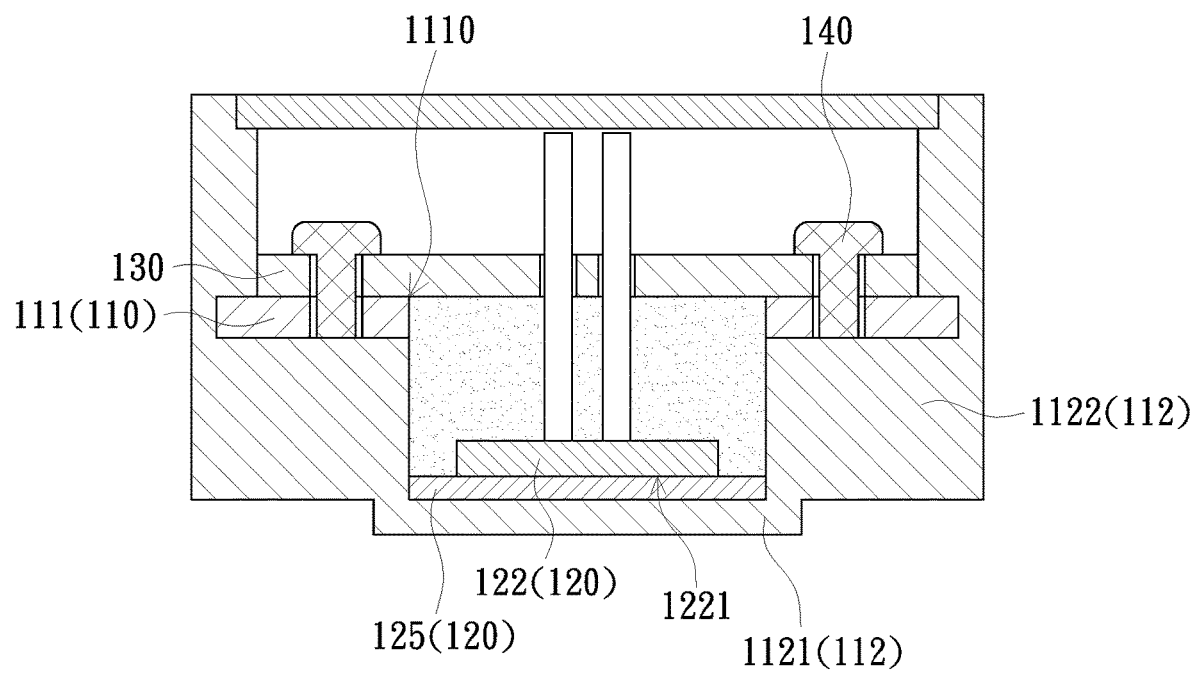
FIG. 1B is a schematic cross-sectional view of an ultrasonic sensing device of an embodiment of the present invention.

FIG. 1A is a schematic exploded view of an ultrasonic sensing device of an embodiment of the present invention. FIG. 1B is a schematic cross-sectional view of an ultrasonic sensing device of an embodiment of the present invention. Please refer to FIG. 1A and FIG. 1B, an ultrasonic sensing device 100 of the embodiment includes a housing 110, a piezoelectric assembly 120, a board 130 and a plurality of fixing members 140. The housing 110 includes a connecting board 111 being a metal board and a supporting shell 112 being a plastic member. The connecting board 111 has a disposing opening 1110. The supporting shell 112 includes a bottom wall 1121 opposite to the disposing opening 1110 and a surrounding side wall 1122 integrally surrounding and connecting to the bottom wall 1121. The surrounding side wall 1122 surrounds a portion of the connecting board 111 at an outer edge of the connecting board 111. The piezoelectric assembly 120 includes an encapsulating body 121 and a piezoelectric sheet 122. At least a portion of the piezoelectric sheet 122 is enclosed by the encapsulating body 121. The encapsulating body 121 is disposed on the bottom wall 1121 and surrounded by the surrounding side wall 1122. The piezoelectric sheet 122 has a sensing surface 1221 exposed to the encapsulating body 121 and facing the bottom wall 1121. The board 130 is disposed on the connecting board 111 of the housing 110 and has a pressing surface 131 facing the encapsulating body 121 and the connecting board 111. The plurality of fixing members 140 is configured to fix the board 130 on the connecting board 111 of the housing 110 to press the board 130 to the encapsulating body 121 of the piezoelectric assembly 120, thereby pressing the sensing surface 1221 of the piezoelectric sheet 122 to the bottom wall 1121.

The housing 110 of the ultrasonic sensing device 100 of the embodiment can be made by a method such as an embedded injection molding method. An outer edge of the connecting board 111 can be placed into a mold cavity (not shown) of plastic forming corresponding to the supporting shell 112, and a liquid plastic is injected into the mold cavity, and the housing 110 is made after the liquid plastic is cooled and the mold cavity is removed.

In the embodiment, a material of the connecting board 111 can be metal such as stainless steel, aluminum alloy or other alloy, but is not limited thereto. A material of the supporting shell 112 can be an insulating material such as polyamide (PA), polyethylene (PE) or polypropylene (PP).

In the embodiment, the surrounding side wall 1122 is further extended toward a direction away from the bottom wall 1121, and the surrounding side wall 1122 has an opening 1123 at an end away from the bottom wall 1121. In Specific, an accommodating space S is formed between the surrounding side wall 1122 and the bottom wall 1121, and the connecting board 111 is located between the opening 1123 of the surrounding side wall 1122 and the bottom wall 1121 so as to be located in the accommodating space S. The ultrasonic sensing device 100 may further include a cover 150 covering the opening 1123 of the surrounding side wall 1122.

In the embodiment, the board 130 may have a single material or a composite material. In the embodiment, the board 130 may be a circuit board. For example, the board 130 may have a disposing surface 132 opposite to the pressing surface 131, and a connector 133 may be disposed on the disposing surface 132 to electrically connect to the piezoelectric sheet 122 or an external device (not shown).

Figure 1C:
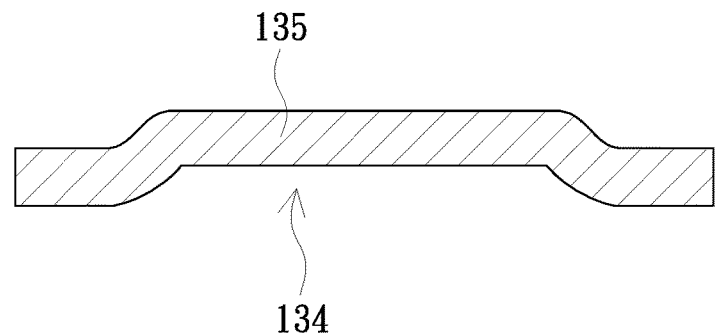
FIG. 1C is a schematic diagram of a board of an embodiment of the present invention.

In the embodiment, the board 130 is flat, but is not limited thereto. For example, FIG. 1C illustrates a board 130a in a bent shape. The board 130a has a concave portion 134 on a side and a corresponding convex portion 135 on the other side. The encapsulating body 121 may abut against the concave portion 134 when the encapsulating body 121 protrudes from the opening 1110 of the connecting board 111. Alternatively, the encapsulating body 121 may abut against the convex portion 135 when the encapsulating body 121 is recessed in the opening 1110 of the connecting board 111.

In the embodiment, the encapsulating body 121 of the piezoelectric assembly 120 has a surrounding shape conformed to the surrounding side wall 1122, such as the round shape as shown in FIG. 1B, but is not limited thereto. The encapsulating body 121 may be conformed to the surrounding side wall 1122 with other shapes, such as polygon. The encapsulating body 121 includes a matching layer and/or an absorbing layer corresponding to vibration energy of the piezoelectric sheet. The material of the matching layer and/or the absorbing layer may include Epoxy, SiOx or other colloid.

In the embodiment, the encapsulating body 121 may further include a colloid layer 125 corresponding to the piezoelectric sheet 122 and disposed on the sensing surface 1221 of the piezoelectric sheet 122 and. The colloid layer 125 may be a matching layer or a conducting layer corresponding to vibration energy of the piezoelectric sheet 122.

In the embodiment, the piezoelectric assembly 120 may further include a positive guide pin 123 having an end connected to the piezoelectric sheet 122 and a negative guide pin 124 having an end connected to the piezoelectric sheet 122. The positive guide pin 123 and the negative guide pin 124 pass through the encapsulating body 121. The board 130 has a through hole 137 and a through hole 138 allowing the positive guide pin 123 and the negative guide pin 124 to pass therethrough respectively. The positive guide pin 123 and the negative guide pin 124 may connect to an external power supply (not shown).

In the embodiment, each of the plurality of fixing members 140 is a screw, the board 130 has a plurality of through holes 136, and the connecting board 111 of the housing 110 has a plurality of screw holes 1111. The board 130 can be fixed to the connecting board 111 and pressed to the encapsulating body 121 by locking the fixing members 140 to the screw holes 1111. The quantity of the fixing members 140 is at least three for balancing the downward pressure on the board 130.

The ultrasonic sensing device 100 of the embodiment can be placed in a liquid. For example, the ultrasonic sensing device 100 and a waveguide tube (not shown) may be incorporated to detect a level of the liquid, or the ultrasonic sensing device 100 and a reflective board (not shown) may be disposed opposite to detect a concentration of the liquid.

Regarding to a manufacturing method of the piezoelectric assembly 120, the piezoelectric sheet 122 can be connected to the encapsulating body 121 in a mold (not shown) in advance, or the piezoelectric sheet 122 can be firstly placed on the bottom wall 1121 of the supporting shell 112, and the liquid encapsulating body 121 is injected through the disposing opening 1110 of the connecting board 111, and the encapsulating body 122 is cured in a space formed by the surrounding side wall 122, the bottom wall 1121 and the connecting board 111.

In the ultrasonic sensing device 100 of the embodiment, the board 130 is used to press the encapsulating body 121, so that the piezoelectric sheet 122 is abutted against the bottom wall 1121 of the housing 110. Comparing with the conventional technology in which the piezoelectric sheet is merely connected to the housing by an encapsulant, the piezoelectric sheet 122 in the embodiment of the invention can be more tightly disposed on the bottom wall 1121 of the housing 110, thereby improving the reliability.

The connecting board 111 of the ultrasonic sensing device 100 of the embodiment used for fixing the board 130 is made of metal to have higher durability, and the bottom wall 1121 for supporting the piezoelectric assembly 120 and the surrounding side wall 1122 for surrounding the piezoelectric assembly 120 are made of plastic to have better resonance characteristics, as such the problem that the conventional technology in which the ultrasonic detection device is difficult to satisfy both of structural strength requirement and resonance characteristics requirement is solved.

Figure 2:
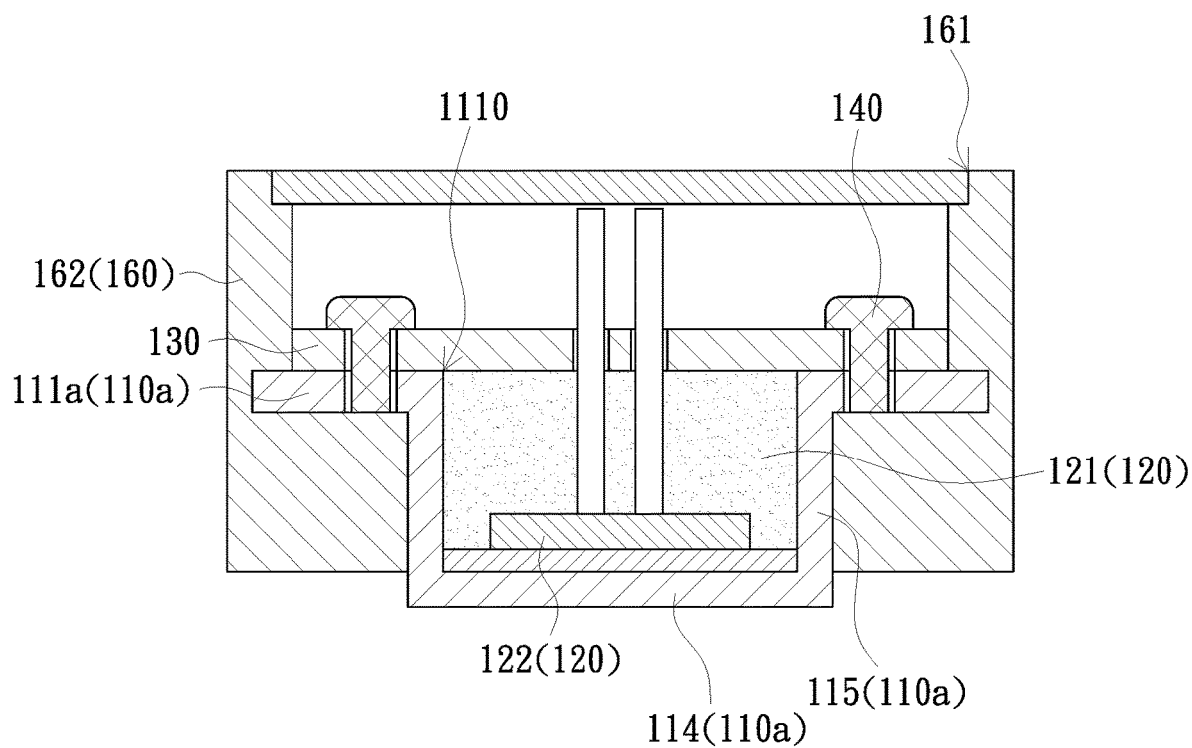
FIG. 2 is a schematic cross-sectional view of an ultrasonic sensing device of another embodiment of the present invention.

FIG. 2 is a schematic cross-sectional view of an ultrasonic sensing device 100a of another embodiment of the present invention. The ultrasonic sensing device 100a of the embodiment includes a housing 110a, a supporting shell 160, a piezoelectric assembly 120, a board 130 and a plurality of fixing members 140. The housing 110a is a metal member and includes a connecting board 111a, a bottom wall 114 and a first surrounding side wall 115 integrally formed. The connecting board 111a has a disposing opening 1110 opposite to the bottom wall 114. The first surrounding side wall 115 is connected between the connecting board 111a and the bottom wall 114.

The supporting shell 160 is a plastic member and includes a second surrounding side wall 162 surrounding a portion of the connecting board 111a at an outer edge of the connecting board 111a. The second surrounding side wall 162 is further extended toward a direction away from the bottom wall 114. The second surrounding side wall 162 has an opening 161 at an end away from the bottom wall 114, wherein the connecting board 111a is located between the opening 161 and the bottom wall 114. Similar to the aforementioned embodiment, the connecting board 111a of the housing 110a can be connected to the supporting shell 160 by using the embedded injection molding method.

The functions and structures of the piezoelectric assembly 120, the board 130 and the fixing members 140 of the ultrasonic sensing device 100a of the embodiment are the same with those of the ultrasonic sensing device 100 of FIG. 1A, therefore no redundant detail is to be given herein.

The difference between the ultrasonic sensing device 100a of the embodiment and the ultrasonic sensing device 100 of FIG. 1A is: in the ultrasonic sensing device 100 of FIG. 1A, the connecting board 111 is the only one element made of metal; however, in the ultrasonic sensing device 100a of the embodiment, the housing 110a including the connecting board 111a, the bottom wall 114 and the first surrounding side wall 115 is made of metal and is integrally formed. The ultrasonic sensing device 100 of FIG. 1A can have better resonance characteristics, and the ultrasonic sensing device 100a of the embodiment can have better durability. A user may use the ultrasonic sensing device 100 of FIG. 1A or the ultrasonic sensing device 100a of the embodiment for different using requirements or conditions.

Figure 3:
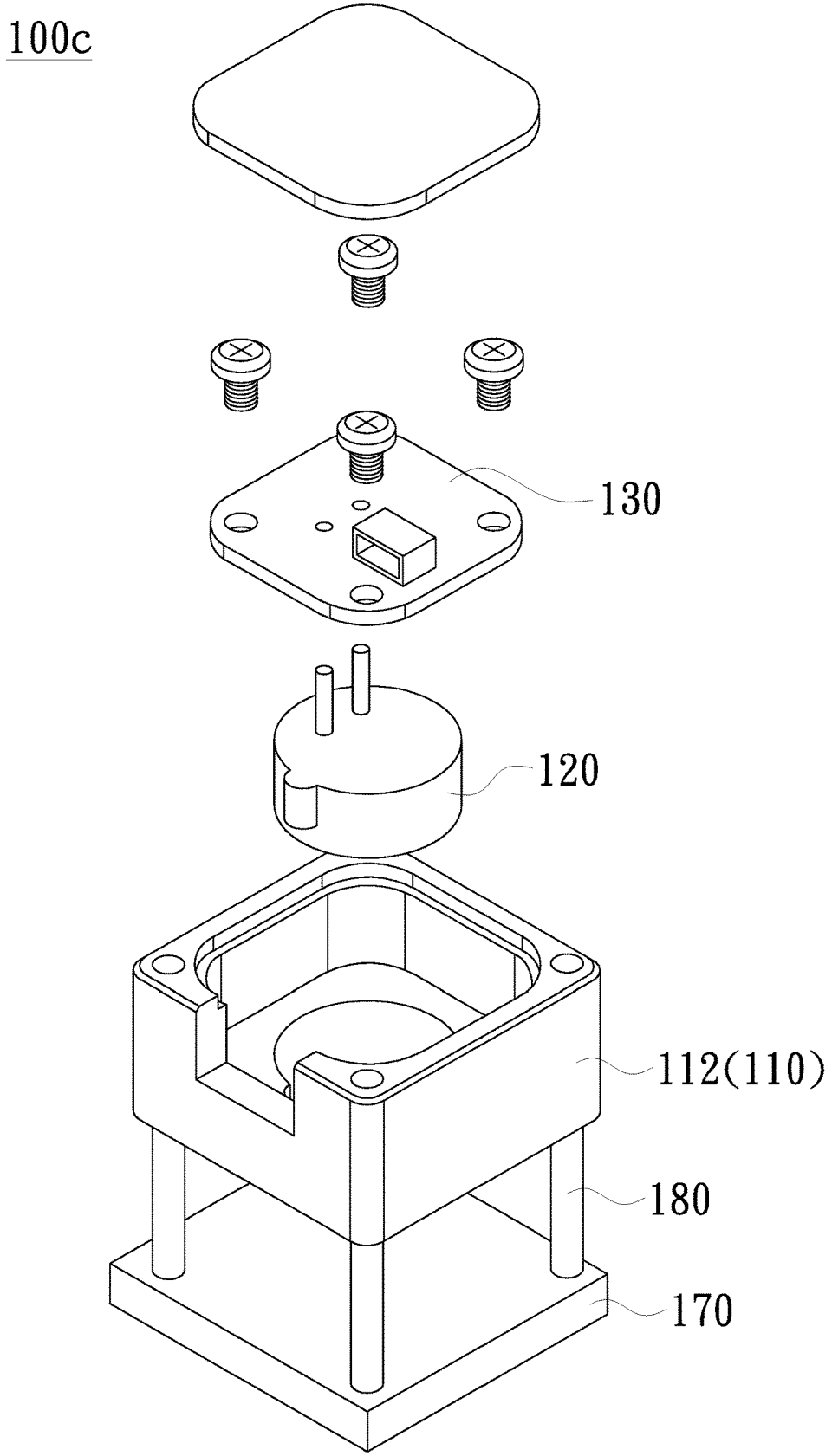
FIG. 3 is a schematic cross-sectional view of an ultrasonic sensing device of an embodiment of the present invention.

FIG. 3 is a schematic cross-sectional view of an ultrasonic sensing device 100c of an embodiment of the present invention. Please refer to FIG. 3, the ultrasonic sensing device 100c of the embodiment is substantially the same with the ultrasonic sensing device 100 of FIG. 1A, the difference is that the ultrasonic sensing device 100c of the embodiment further includes a reflecting board 170 and a plurality of connecting rods 180. The reflecting board 170 is disposed opposite to the supporting shell 112 of the housing 110, and the connecting rods 180 are connected between the reflecting board 170 and the supporting shell 112. The reflecting board 170 can be used for reflecting a vibration signal of the piezoelectric assembly 120 to detect a concentration of a liquid. In another aspect, the embodiment can be also applied to the ultrasonic sensing device 100a of FIG. 2.

In the ultrasonic sensing device of the embodiments of the present invention, a board is used to press the encapsulating body, so that the piezoelectric is abutted against the bottom wall of the housing. Comparing with the conventional technology in which the piezoelectric sheet is merely connected to the housing by an encapsulant, the piezoelectric sheet of the embodiments of the present invention can be more tightly disposed on the bottom wall of the housing, thereby improving the reliability.

The connecting board of the ultrasonic sensing device of the embodiments used for fixing the board is made of metal to have higher durability, and the bottom wall for supporting the piezoelectric assembly and the surrounding side wall for surrounding the piezoelectric assembly are made of plastic to have better resonance characteristics, as such the problem that the conventional technology in which the ultrasonic detection device is difficult to satisfy both of structural strength requirement and resonance characteristics requirement is solved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An ultrasonic sensing device, comprising:
    a housing, comprising:
        a connecting board, having a disposing opening; and
        a supporting shell, comprising a bottom wall opposite to the disposing opening of the connecting board and a surrounding side wall integrally surrounding and connecting to the bottom wall, wherein the surrounding side wall surrounds a portion of the connecting board at an outer edge of the connecting board;
    a piezoelectric assembly, comprising an encapsulating body and a piezoelectric sheet, wherein at least a portion of the piezoelectric sheet is enclosed by the encapsulating body, the encapsulating body is disposed on the bottom wall of the supporting shell and surrounded by the surrounding side wall, and the piezoelectric sheet has a sensing surface exposed to the encapsulating body and facing the bottom wall;
    a board, disposed on the connecting board and having a pressing surface facing the encapsulating body and the connecting board; and
    a plurality of fixing members, configured to fix the board on the connecting board of the housing to press the board to the encapsulating body of the piezoelectric assembly, thereby pressing the sensing surface of the piezoelectric sheet to the bottom wall;
    wherein the connecting board is a metal board, and the supporting shell is a plastic member.

2. The ultrasonic sensing device according to claim 1, wherein the board is a circuit board.

3. The ultrasonic sensing device according to claim 1, wherein the piezoelectric assembly further comprises a positive guide pin having an end connected to the piezoelectric sheet and a negative guide pin having an end connected to the piezoelectric sheet, the positive guide pin and the negative guide pin pass through the encapsulating body, and the board has two openings allowing the positive guide pin and the negative guide pin to pass therethrough.

4. The ultrasonic sensing device according to claim 1, wherein the encapsulating body is adhered to the surrounding side wall.

5. The ultrasonic sensing device according to claim 1, wherein the encapsulating body has a surrounding shape conformed to an adjacent portion of the surrounding side wall.

6. The ultrasonic sensing device according to claim 1, wherein the piezoelectric assembly further comprises a matching layer or a conducting layer disposed on the sensing layer of the piezoelectric sheet and corresponding to vibration energy of the piezoelectric sheet.

7. The ultrasonic sensing device according to claim 1, wherein each of the plurality of fixing members is a screw, the board has a plurality of through holes, and the connecting board has a plurality of screw holes.

8. The ultrasonic sensing device according to claim 1, wherein the surrounding side wall is further extended toward a direction away from the bottom wall, and the surrounding side wall has an opening at an end far from the bottom wall, the connecting board is located between the opening of the surrounding side wall and the bottom wall, and the ultrasonic sensing device further comprises a cover covering the opening.

9. The ultrasonic sensing device according to claim 1, wherein the encapsulating body comprises a matching layer and/or an absorbing layer corresponding to vibration energy of the piezoelectric sheet.

10. An ultrasonic sensing device, comprising:
    a housing comprising a connecting board, a bottom wall and a first surrounding side wall, wherein the connecting board, the bottom wall and the first surrounding side wall are integrally connected, the first surrounding side wall is connected between the connecting board and the bottom wall, and the connecting board has a disposing opening opposite to the bottom wall;
    a supporting shell, comprising a second surrounding side wall surrounding a portion of the connecting board at an outer edge of the connecting board, the second surrounding side wall is further extended toward a direction away from the bottom wall, the second surrounding side wall has an opening at an end away from the bottom wall, the connecting board is located between the opening and the bottom wall;
    a piezoelectric assembly, comprising an encapsulating body and a piezoelectric sheet, wherein at least a portion of the piezoelectric sheet is enclosed by the encapsulating body, the encapsulating body is disposed on the bottom wall and surrounded by the first surrounding side wall, and the piezoelectric sheet has a sensing surface exposed to the encapsulating body and facing the bottom wall;
    a board, disposed on the connecting board of the housing and having a pressing surface facing the encapsulating body and the connecting board; and
    a plurality of fixing members, configured to fix the board on the housing to press the board to the encapsulating body of the piezoelectric assembly, thereby pressing the sensing surface of the piezoelectric sheet to the bottom wall;
    wherein the housing is a metal member, and the supporting shell is a plastic member.

11. The ultrasonic sensing device according to claim 10, wherein the board is a circuit board.

12. The ultrasonic sensing device according to claim 10, wherein the piezoelectric assembly further comprises a positive guide pin having an end connected to the piezoelectric sheet and a negative guide pin having an end connected to the piezoelectric sheet, the positive guide pin and the negative guide pin pass through the encapsulating body, and the board has two openings allowing the positive guide pin and the negative guide pin to pass therethrough.

13. The ultrasonic sensing device according to claim 10, wherein the encapsulating body is adhered to the first surrounding side wall.

14. The ultrasonic sensing device according to claim 10, wherein the encapsulating body has a surrounding shape conformed to the first surrounding side wall.

15. The ultrasonic sensing device according to claim 10, wherein the piezoelectric assembly further comprises a matching layer or a conducting layer disposed on the sensing layer of the piezoelectric sheet and corresponding to vibration energy of the piezoelectric sheet.

16. The ultrasonic sensing device according to claim 10, wherein each of the plurality of fixing members is a screw, the board has a plurality of through holes, and the connecting board has a plurality of screw holes.

17. The ultrasonic sensing device according to claim 10, wherein the encapsulating body comprises a matching layer and/or an absorbing layer corresponding to vibration energy of the piezoelectric sheet.

* * * * *